United States Patent [19]
Spyrou et al.

[11] Patent Number: 5,841,672
[45] Date of Patent: Nov. 24, 1998

[54] METHOD AND APPARATUS FOR VERIFYING SIGNAL TIMING OF ELECTRICAL CIRCUITS

[75] Inventors: Athanasius W. Spyrou, San Jose; Michael Grossman, Mt. View; Michael Misheloff, Dublin; Thomas Schaefer, Cupertino; Marie C. Salet, Fremont; Clementina Bures, Santa Clara, all of Calif.

[73] Assignee: VLSI Technology, Inc., San Jose, Calif.

[21] Appl. No.: 600,507

[22] Filed: Feb. 13, 1996

[51] Int. Cl.$^6$ .................................................. G06F 17/50
[52] U.S. Cl. ........................................ 364/488; 364/489
[58] Field of Search .................................. 364/488, 489, 364/490, 491, 578

[56] References Cited

U.S. PATENT DOCUMENTS

| | | | |
|---|---|---|---|
| 4,698,760 | 10/1987 | Lembach et al. | 364/490 |
| 4,744,084 | 5/1988 | Beck et al. | 371/23 |
| 4,827,428 | 5/1989 | Dunlop et al. | 364/491 |
| 4,924,430 | 5/1990 | Zasio et al. | 364/578 |
| 4,961,156 | 10/1990 | Takasaki | 364/578 |
| 4,965,758 | 10/1990 | Sherman | 364/578 |
| 5,003,487 | 3/1991 | Drumm et al. | 364/489 |
| 5,274,568 | 12/1993 | Blinne et al. | 364/489 |
| 5,475,607 | 12/1995 | Apte et al. | 364/489 |
| 5,544,071 | 8/1996 | Keren et al. | 364/489 |
| 5,572,437 | 11/1996 | Rostoker et al. | 364/489 |
| 5,617,325 | 4/1997 | Schaefer | 364/488 |
| 5,625,803 | 4/1997 | McNelly et al. | 395/500 |

OTHER PUBLICATIONS

"Signal Propagation Delay in RC Models for Interconnect" by J.L. Wyatt, Jr., *Circuit Analysis, Simulation and Design*, 2 ed., A.E. Ruehli, Elsevier, 1987, pp. 254–291.

"Signal Delay in RC Tree Networks", J. Rubinstein, P. Penfield and M.A. Horowitz, *IEEE Transactions on Computer–Aided Design*, 2 (1983), 202–211.

"Signal Delay in RC Mesh Networks", J.L. Wyatt, Jr., *IEEE Transactions on Circuits Systems*, 32 (1985), 507–510.

"Relaxing bounds for linear RC mesh circuits", C.A. Zukowski, *IEEE Transactions on Computer–Aided Design*, 5 (1986), 305–312.

"Bounds on Signal Delay in RC Mesh Networks", P.K. Chan and M.D.F. Schlag, *IEEE Transactions on Computer–Aided Design*, 8 (1989), 581–589.

"Timing Models for MOS Pass Networks", M.A. Horowitz, *International Symposium on Circuits and Systems*, pp. 198–201, IEEE, 1983.

"Timing Models for MOS Circuits", Thesis, M.A. Horowitz, Stanford University, 1983.

"Macromodeling CMOS Circuits for Timing Simulation", L.M. Brocco, S.P. McCormick and J. Allen, *IEEE Transactions on Computer–Aided Design*, 7 (1988), 1237–1249.

"Modeling The 'Effective Capacitance' for the RC Interconnect of CMOS Gates", Qian et al, *IEEE Transactions on Computer–Aided Design*, vol. 13. No. 12, Dec. 1994, pp. 1526–1535.

"The Transient Response of Damped LInear Networks with Particular Regard to Wideband Amplifiers", W.C. Elmore, *Journal of Applied Physics*, vol. 19, Jan. 1948, pp. 55–63.

(List continued on next page.)

*Primary Examiner*—Kevin J. Teska
*Assistant Examiner*—Leigh Marie Garbowski
*Attorney, Agent, or Firm*—Burns, Doane, Swecker & Mathis LLP

[57] ABSTRACT

The present invention is directed to a method and apparatus for accurately estimating signal delays of an electrical circuit by taking into account both resistance and capacitance of an interconnect network when determining both gate delays and interconnect delays of the circuit. Exemplary embodiments of the present invention, by providing a highly accurate estimate of signal delays, result in highly efficient, cost-effective electrical circuit design and fabrication. Further, a high degree of customer satisfaction can be realized because the possibility that a given electrical circuit will not comply with customer specified time constraints is minimal.

19 Claims, 3 Drawing Sheets

OTHER PUBLICATIONS

"Modeling the Driving–Point Characteristic of Resistive Interconnect for Accurate Delay Estimation", P. R. O'Brien et al., *IEEE*, 1989, pp. 512–515.

"Coping with RC(L) Interconnect Design Headaches", L. Pileggi, *IEEE*, 1995, pp. 246–253.

"EXCL: A Circuit Extractor for IC Designs", S.P. McCormick, *21st Design Automation Conference (IEEE)*, 1994, pp. 616–623.

"Signal Delay in General RC Networks With Application To Timing Simuation of Digital Intergrated Circuits", Lin et al., 1984 Conf. on Advanced Research in VLSI, pp. 93–99.

"Switch–Level Delay Models for Digital MOS VLSI", John K. Ousterhout; *21st Design Automation Conference (IEEE)*, 1994, pp. 542–548.

METHOD AND APPARATUS FOR VERIFYING SIGNAL TIMING OF ELECTRICAL CIRCUITS

BACKGROUND OF THE INVENTION

1. Field of the Invention

The present invention relates generally to the field of electrical circuit design and fabrication, and more particularly, to a method and apparatus for verifying proper circuit operation.

2. State of the Art

In the design and fabrication of electrical circuits, such as integrated circuits, it is important to verify proper circuit operation. For example, characteristics of a circuit which are typically verified to ensure that a circuit will properly perform its intended function include verification of intended signal processing speed. Presently, tools for assisting in the verification of proper circuit operation include logic simulators and timing verifiers. Both of these tools are supplied with specified inputs for verifying electrical circuit operation.

Electrical circuits are typically composed of plural components interconnected by conductive paths. Accordingly, logic simulator and timing verifier tools are typically supplied with estimates of the component signal delays representing the time required for a signal to propagate through each individual component of the circuit. Further, these tools are supplied with separate estimates of the signal path delays associated with the wires connecting one component to another.

The time it takes a signal to propagate through a component, such as a logic gate, is typically referred to as the "gate delay". The delay associated with the interconnect for connecting one gate to another is typically referred to as the "interconnect delay".

As those skilled in the art will appreciate, the interconnect delay depends on the resistance and capacitance of the conductive paths between gates. Further, the interconnect delay depends on driving characteristics of the gate or gates which are used to drive the interconnect. As referenced herein, the "driving characteristics" of a gate can be considered to include the slope of the gate output signal when the gate is transitioned from one value to another, such as from one logic state (e.g., logic level "0") to another logic state (e.g., logic level "1"), or vice versa.

Early tools for estimating signal delays in electrical circuits considered the interconnect resistance to be negligible when estimating the interconnect delay. That is, the resistance of the interconnect was considered to be zero, and therefore not taken into consideration when calculating an estimated interconnect delay attributable to the conductive paths between gates. These tools estimated interconnect delay based on a total estimated capacitance of the interconnect network used to connect a first logic gate to other logic gates, and on the strength of the driving gate. An estimated interconnect delay which is a function of the total output network capacitance and the strength of the driving gate is typically referred to as a "lumped delay estimate" because the estimate considers the capacitance of the output network to be lumped at one point with no intervening resistance.

Figure 1:
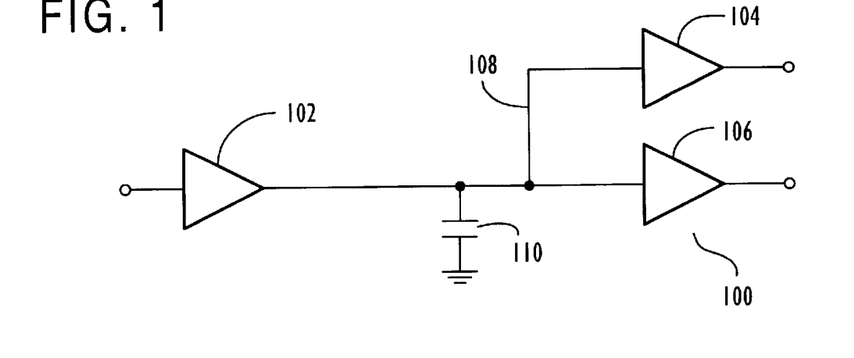
FIG. 1 illustrates an exemplary equivalent circuit diagram wherein a capacitance of an interconnect network between gates is represented as a lumped capacitance and wherein resistance of the interconnect is ignored.

For example, FIG. 1 illustrates an exemplary electrical circuit including a driving gate 102 and two receiving gates 104 and 106. The driving gate 102 is connected to the receiving gates 104 and 106 via an output interconnect network 108 having a lumped capacitance 110. The lumped capacitance 110 represents an estimate of the total capacitance associated with conductive paths between the driving gate 102 and the receiving gates 104 and 106. In estimating the interconnect delay of the network 108 using known signal delay estimation tools, only the lumped capacitance 110 is taken into consideration, as any resistance associated with the interconnect paths is considered to be zero.

More recently, electrical circuits have been developed with interconnects having conductive paths of reduced cross-sectional area. As a result, the resistance of these paths has become a more significant consideration in the accurate estimation of signal delays through the circuit. Accordingly, more recent attempts to accurately estimate signal delays have taken both the resistance and capacitance of the interconnect into account. Such delay estimates are typically referred to as "RC delay estimates", these RC delay estimates being produced by circuit development tools known as RC delay calculators. Although RC delay calculators account for resistance when determining an interconnect delay, they do not model gate delays when determining interconnect delays.

Gate modeling methods have, however, also become increasingly more accurate. More recent gate models used to provide gate delay estimates take into account characteristics of gates such as the slew time of input signals. Models of gate delays which take into account the effects of input signal slew time are known in the art as "input-slope gate models". However, even these more recent gate models represent the output network of the gate using a lumped capacitance as described previously with respect to FIG. 1. These models do not take into account the resistance of the output network which the gate is driving. Thus, although advancements in technology have resulted in the use of tools for estimating interconnect delays as a function of both resistance and capacitance, conventional tools for estimating gate delays do not model the gate delays as a function of interconnect resistance.

In summary, conventional tools for estimating signal delays of an electrical circuit, at best, represent a combination of: (1) a tool which produces a relatively accurate gate model to estimate the effect of input slew times but which ignores the resistance of the output network which the gate is driving; and (2) an RC delay calculator which can accurately model the effect of resistance when calculating an interconnect delay but which cannot model the effects of the driving gate's input slew times on delay through the gate and interconnect.

Accordingly, there is presently no accurate and practical technique for estimating signal delays of an electrical circuit by taking into account both the capacitance and resistance of an interconnect network between gates when assessing both interconnect delays and gate delays. The inaccuracies which result from using presently available tools can require a circuit redesign and refabrication that is both costly and time consuming for the circuit designer, fabricator and end user.

SUMMARY OF THE INVENTION

The present invention is directed to a method and apparatus for accurately estimating signal delays of an electrical circuit by taking into account both resistance and capacitance of an interconnect network when determining both gate delays and interconnect delays of the circuit. Exemplary embodiments of the present invention, by providing a highly accurate estimate of signal delays, result in highly efficient, cost-effective electrical circuit design and fabrication.

Further, a high degree of customer satisfaction can be realized because the possibility that a given electrical circuit will not comply with customer specified time constraints is significantly reduced.

Generally speaking, exemplary embodiments of the present invention relate to a method and apparatus of verifying operation of an electrical circuit comprising the steps of: producing an electrical circuit having at least one gate and an output network connected with the gate; obtaining an estimated total gate delay and an estimated gate output slew time of the gate using a gate timing model; producing a differential estimated output network delay as a function of output network resistance and estimated gate driving strength for a destination point of the output network; and combining the estimated total gate delay and the estimated output network delay to produce a combined delay from an input of the gate to said destination point.

Further, exemplary embodiments of the present invention relate to a method and apparatus of verifying operation of an electrical circuit comprising the steps of: producing an electrical circuit having at least one gate and an output network connected with the gate; obtaining an estimated total gate delay and an estimated gate output slew time of the gate using a gate timing model; producing an estimated output network delay as a function of output network resistance and estimated gate driving strength for a destination point of the output network; and combining the estimated output network delay and the estimated gate output slew time to produce an estimated destination point slew time at said destination point of the output network.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

Figure 2:
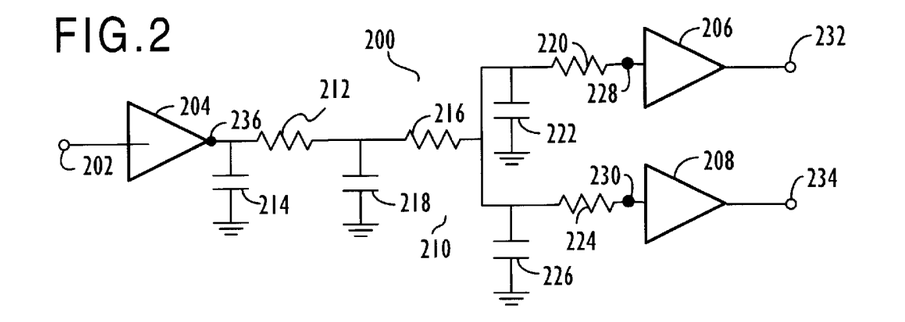
FIG. 2 illustrates an exemplary equivalent circuit diagram wherein multiple capacitances and resistances of an interconnect network are illustrated in segments.

FIG. 2 shows an equivalent circuit diagram of an electrical circuit modeled in accordance with an exemplary embodiment of the present invention to include both resistances and capacitances. In the FIG. 2 equivalent circuit 200, an input node 202 receives an input waveform having an input slew (i.e., input waveform transition time or input slope). The input node 202 supplies the input waveform to a first gate 204.

As referenced herein, a "gate" can be any device for processing an input waveform, such as a logic gate (e.g., AND gate, OR gate and so forth) or a single transistor.

The first gate 204 can be considered a driving gate which supplies a drive signal to one or more receiving gates 206 and 208 via an interconnect 210. In accordance with exemplary embodiments, the interconnect 210 is modeled as one or more segments, each of the segments being represented by an equivalent capacitance and resistance. For example, a first segment of the interconnect 210 is modeled with an interconnect resistance 212 and a capacitance 214. A second segment of the interconnect 210 is modeled with a resistance 216 and a capacitance 218. A third interconnect segment is represented as a resistance 220 and a capacitance 222. A fourth interconnect segment is represented as including a resistance 224 and a capacitance 226.

Nodes 228 and 230 of the interconnect 210 constitute destination points, or receiving points, of the interconnect. The destination points 228 and 230 constitute input nodes to the gates 206 and 208, respectively. In the exemplary FIG. 2 equivalent circuit, outputs from the gates 206 and 208 drive output nodes 232 and 234, respectively.

Figure 3:
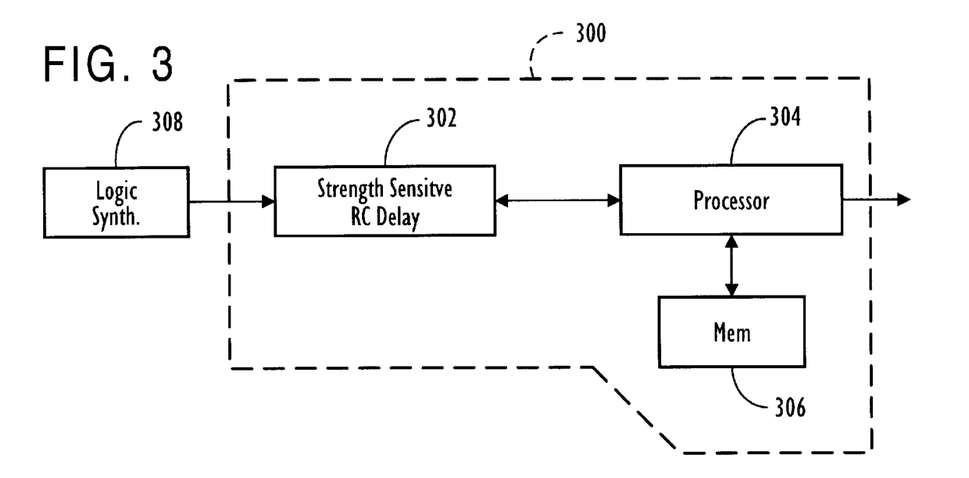
FIG. 3 illustrates an exemplary embodiment of a timing verifier tool in accordance with an exemplary embodiment of the present invention.

In accordance with exemplary embodiments, signal delays of an electrical circuit corresponding to the equivalent circuit of FIG. 2 can be accurately determined using an apparatus for verifying operation of an electrical circuit as illustrated in FIG. 3. The FIG. 3 apparatus corresponds to a timing verifier tool 300 having a means for producing an estimated output network delay as a function of output network resistance and estimated gate driving strength, such as a strength sensitive resistive-capacitive (RC) delay calculator 302. The timing verifier tool further includes a means for processing an estimated total gate delay and the estimated output network delay to produce a combined delay from an input of the gate to one or more destination points, such as a processor 304. The processor 304 can also process the estimated output network delay and an estimated gate output slew time to produce an estimated destination point slew time at one or more destination points. A memory 306 can be used to store, among other data and/or information, processing steps for the RC delay calculator 302 and/or to implement the functionality described herein. Of course those skilled in the art will appreciate that the architecture of FIG. 3 is by way of example only, and that functionality of the individual elements shown in FIG. 3 can be distributed among one or more components in any manner desired.

To verify operation of an electrical circuit, exemplary embodiments include means, such as a logic synthesizer 308, for producing an electrical circuit having at least one gate and an output interconnect network connected with the at least one gate. As mentioned previously, an equivalent of such a circuit is illustrated in FIG. 2.

In operation, an estimated total gate delay and an estimated gate output slew time of the gate (such as gate 204) are obtained using any known gate timing model. For example, a typical input-slope gate model can be used to compute gate output quantities as a function of certain input parameters.

In an exemplary embodiment, the input parameters can include a list of pre-stored timing parameter values for the gate through which a delay is to be computed. The process of precomputing these values is known in the art as "characterization" of the gate.

The typical input parameters of an input-slope gate model further include the names of an input pin and an output pin of the gate through which timing is to be computed. The computed timing of the gate provides a representation of the time it takes a signal value on a specified input pin to propagate to a specified output pin. Referring to the exemplary FIG. 2 circuit, an input pin of gate 204 can be specified as the input node 202 and an output pin of the gate 204 can be specified as a driving node 236. The delay from the input node 202 to the driving node 236 can then be determined to correspond to the time it takes an input signal which has transitioned to a given threshold at node 202 to produce an output signal which transitions to a threshold at node 236. More particularly, in the case of a rising signal (e.g., a transition from a logic level "0" to a logic level high "1"), the input waveform at input node 202 will pass a threshold used to define a logic level 1 at a given point in time. From the moment the input signal crosses that threshold until an output signal of gate 204 at node 236 crosses through a threshold corresponding to a logic level 1 represents the gate delay.

The input parameters of a typical input-slope gate model further include the slew time, or input slope, of a signal arriving at the input pin. In the exemplary FIG. 2 circuit, the slew time of the gate 204 would be the slope of a waveform at input node 202. This input slope can be a user defined parameter.

Input parameters of a typical input-slope gate model further include the load on the output pin. For example, with respect to gate 204, the load on the driving node 236 would be stored in conjunction with the gate model of gate 204. For metal-oxide semiconductor (MOS) circuits, the load can be considered a simple capacitive load, or a "lumped capacitance" similar to the lumped capacitance 110 described with respect to FIG. 1. For other technologies, such as emitter coupled logic (ECL), the load can be modeled to include more than one component, such as a capacitive load and a current-drain load. For purposes of simplifying the following discussion, exemplary embodiments will be described in the context of a gate model wherein the load driven by the gate is considered to be a simple capacitive load. However, those skilled in the art will appreciate that exemplary embodiments of the present invention are not limited to an equivalent circuit wherein a gate model is stored with respect to a purely capacitive load, but rather is applicable to gates modeled with more complex load models.

Having described the typical input parameters of a conventional input-slope gate model, the output quantities to be computed using the input parameters for a given gate are typically twofold. First, the input parameters of a given gate are typically used to produce a "total gate delay" and to produce an "output slew time."

The total gate delay produced using an input-slope gate model can, for purposes of the following discussion, be considered an estimate of the delay time associated with the gate. This delay was described above as the time period from when an input signal reaches a fixed input threshold, or trip-point, up to the time at which the output signal of the gate reaches a fixed output trip-point. The output slew time can be considered, for purposes of the following discussion, to be an estimate of the slope of the voltage as a function of time waveform produced on the output network of the interconnect.

Those skilled in the art will appreciate that there are numerous ways of defining slew time. However, for purposes of simplifying the following discussion, a definition of slew time will be considered as the linearized transition time of a signal from the voltage rail (e.g., ground) to a target trip-point. The term "linearized" as referenced herein represents a slope at a mid-portion of a waveform which has been extrapolated to intersect the voltage rail, the slew time being the time required for the straight line to transition from the intersection with the initial voltage rail to the trip point.

Although the use of an input-slope gate model is known for producing an output slew time for a gate in a circuit, conventional systems which assume a lumped capacitance to be the sole load of a gate necessarily consider the output slew time of one gate to be equal to the input slew time of a subsequent gate located at a destination point. For example, referring to the exemplary FIG. 2 equivalent circuit, where an output slew time is calculated for the gate 204, an assumption that the resistance of the interconnect 210 is zero results in an estimate that the input slew time of gates 206 and 208 is equal to the output slew time of the gate 204. However, applicants have discovered that with reductions in cross-sectional areas of conductive paths included in an interconnect, resistances cannot be ignored in estimating delays of the interconnect, in estimating the slew time at destination points and in estimating the effect of these destination point slew times on downstream interconnects (e.g., interconnects driven by output nodes 232 and 234). Because the output network typically includes multiple destination points, with different path resistances existing for each of the different destination points, a separate total gate delay and a separate output slew time are determined in accordance with exemplary embodiments of the present invention for each destination point of the interconnect. Thus, referring to the exemplary FIG. 2 embodiment, a separate total gate delay and a separate destination point slew time are determined for each of the destination points 228 and 230.

Note that changes in the estimated output slew time for each of the destination points 228 and 230 will result in changes of the output slew time determined for output nodes 232 and 234. In an exemplary embodiment where nodes 232 and 234 drive additional interconnect networks, interconnect delays of these additional interconnect networks are reassessed each time the output slew time is recalculated for nodes 228 and 230, as will be further described later.

In reality, every signal transition is either rising or falling, and separate delay estimates are produced depending on whether an input signal and an output signal are rising or falling. For purposes of simplifying the following discussion, distinctions between rising and falling signals will be considered negligible. However, those skilled in the art will readily appreciate that exemplary embodiments of the present invention can easily be modified to take into account any discrepancies between rising and falling transitions.

Further, those skilled in the art will appreciate that while an exemplary input-slope gate model has been described above as including an input slew time as an input parameter, the present invention is not directed to the use of any one type of gate model. For example, those skilled in the art will appreciate that an input slew time need not be provided in order to produce an estimated output slew time of a gate. Rather, a standard propagation/ramp delay model can, for example, be used to estimate output slew time as a product of ramp factor and load. Although many different input slope gate models can be used, for purposes of the following discussion, a "gate model" will be considered a gate model which can estimate an output slew time for a gate.

Having obtained an estimated total gate delay and an estimated gate output slew time of a gate using a gate timing model, exemplary embodiments of the present invention calculate an estimated gate driving strength (e.g., a ramp factor) using the estimated gate output slew time and a load characteristic of the output network. In accordance with exemplary embodiments, the load characteristic of the output network used to calculate the gate driving strength is the lumped capacitance of the interconnect 210.

In accordance with exemplary embodiments, the gate driving strength is supplied to an RC delay calculator which is dependent on a property of the driving device referred to herein as its "strength. " For purposes of the following discussion, "strength" will be considered a first-order estimate of the impedance of a driving device. The "strength" can be considered a "ramp factor." A ramp factor, for purposes of the following discussion, is a number which, when multiplied by the total load of the output network, provides an estimate of the time a pin takes to drive the output network to a fixed output trip-point. Ramp factors are typically expressed in units of nanoseconds per picoFarad (ns/pF).

The calculation of an estimated gate driving strength is a prerequisite to the use of a strength sensitive RC delay calculator, such as the RC delay calculator described in commonly assigned co-pending U.S. application Ser. No. 07/941,763 filed Sep. 4, 1992 entitled "A Method for Estimating Interconnect Delays in Integrated Circuits," which is a continuation of U.S. application Ser. No. 07/542,382 filed Jun. 22, 1990, the contents of which are hereby incorporated by reference in their entireties. In accordance with an alternate exemplary embodiment of the present invention, the gate driving strength can be supplied to an RC delay calculator as described in a document entitled "Signal Delay in RC Tree Networks" by Rubinstein, J., P. Pennfield and M. A. Horowitz, IEEE Transactions, CAD 2 (1983), pages 202–211, also incorporated herein by reference. In accordance with the known Rubinstein, Pennfield and Horowitz method, dependence on input gate driving strength is achieved by representing the driving device as a linear resistor which is analyzed as part of the output network, the size of the resistor being chosen to produce a ramp factor equal to that of the driving device. Use of the Rubinstein, Pennfield and Horowitz method involves a tradeoff in accuracy as compared to the method described in the co-pending application, but simplifies characterization of the interconnect delay.

Those skilled in the art will appreciate that typical application specific integrated circuit (ASIC) libraries include a ramp factor or similar value for each input-to-output path of each gate included in the library. Separate ramp factors are usually provided for rising and falling transitions. However, as described previously, for purposes of simplifying the following discussion, distinctions between rising and falling transitions will be considered negligible. Where a ramp factor is provided for each gate, it need not be calculated from estimated gate output slew time and a load characteristic, but rather, can be retrieved from memory. However, in accordance with exemplary embodiments, the stored ramp factor can be updated whenever input parameters of the gate are modified.

Using a strength sensitive RC delay calculator a differential estimated output network delay can be produced as a function of output network resistance and estimated gate driving strength for each given destination point of the output network. More particularly, the estimated gate driving strength as described above is supplied as an input to the strength sensitive RC delay calculator. The strength sensitive RC delay calculator takes both the capacitance and the resistance of the output network into account in determining an output delay (e.g., a delay at destination point 228 of FIG. 2 relative to driving node 236), to produce a first estimated output network delay. Then, in accordance with an exemplary embodiment of the present invention, the estimated gate driving strength of the gate is used to produce a second estimated output network delay as a function of the lumped capacitance of interconnect 210. The resistance of the interconnect is set to zero to determine the second estimated output network delay. The difference between the first estimated output network delay (i.e., wherein both the resistance and capacitance of the output network were taken into account) relative to the second estimated output network delay (wherein only lumped capacitance was taken into account) are used to produce a differential estimated output network delay which those skilled in the art will recognize to be a function of the resistance in the output network.

The differential estimated output network delay can be considered a "delta delay" which is produced as a function of the output network resistance. A differential estimated output network delay can be produced for each destination point of the output network. Referring to the exemplary FIG. 2 circuit diagram, a differential estimated output network delay can be produced for each of the destination points 228 and 230, respectively. Note that because the differential estimated output network delay is produced as a function of the gate driving strength which in turn is a function of the driving gate's output slew (e.g., the output slew on node 236), the differential estimated output network delay can be iteratively updated each time the output slew is updated as will be described later.

An illustration of a calculation of a differential estimated gate driving strength may clarify the foregoing discussion. Assume that the first gate of FIG. 2, gate 204, is modeled with a 1 nanosecond rise time, and that an output rise time is delayed by 1 nanosecond and has a slope that, after the 1 nanosecond delay, rises from ground over a period of 4 nanoseconds. Thus, the output slew time can be considered 4 nanoseconds and the total gate delay is 5 nanoseconds. If the total lumped capacitance of the output network is estimated to be 3.7 picoFarads, then the ramp factor which corresponds to the output slew time divided by the total lumped capacitance corresponds to 4 nanoseconds/3.7 picoFarads, or 1.1 nanoseconds/picoFarads.

When such a ramp factor is supplied to the input of a strength sensitive RC delay calculator, the user can instruct the calculator to produce a first estimated gate driving strength using the resistance and capacitance of the output network. Afterwards, the user can set the resistance of the interconnect to zero for each instance (e.g., each gate) in a netlist and instruct the strength sensitive RC delay calculator to produce a second estimated output network delay as a function of the total lumped capacitance of the output network. Finally, a differential between the first and second estimated output network delays can be used to produce the differential estimated output network delay. Where the differential estimated gate driving strength is, for example, 0.3 nanoseconds, this value can be stored for the associated destination point (e.g., destination point 228). The differential estimated gate driving strength for destination point 230 can be greater than, less than or equal to that of the destination point 228. The differential estimated output network delay for destination point 230 will be considered 0.5 nanoseconds for the following discussion.

In the above example, the differential delay calculated for each destination point of an interconnect can be defined, for an output network wherein destination points are defined: 1, 2, . . . , K as follows:

delta delay$_i$=actual delay$_i$−lumped delay for i=1, 2, . . . , K. The lumped delay does not depend on i, because in the absence of resistance, all points on the output network will change together. Thus, the strength sensitive RC delay calculator computes the differential delays by: (1) computing an RC delay for each given destination point; (2) computing an RC delay for each of the destination points on a modified netlist wherein all resistances have been changed to zero; and then (3) subtracting the second RC delay from the first.

After producing a differential estimated output network delay for each of the destination points, a combined delay is produced for each destination point. The combined delay of a given destination point corresponds to the estimated total gate delay of the driving gate and the differential estimated output network delay of the destination point. This process can be repeated for each of the destination points to produce a combined delay for each of the destination points.

For example, in the above example, where the total gate delay was 5 nanoseconds and the differential estimated output network delay for destination point 228 was 0.3 nanoseconds, the combined delay for destination point 228 would be 5.3 nanoseconds. Similarly, the combined delay for destination point 230 would be 5.5 nanoseconds. Note that the combined delay at each of the destination points includes the 1 nanosecond delay which occurred through the gate 204, the delay in slew time between the input node 202 and the driving node 236, and the differential estimated output network delay for the given destination point. Thus, a combined network delay from an input node 202 to each of the destination points in an equivalent circuit such as that of FIG. 2 can be provided as an accurate estimate of the delay from a circuit input to a receiving point of a subsequent gate.

In addition to determining the combined delay from an input node to a given destination point, exemplary embodiments of the present invention combine the differential estimated output network delay and the estimated gate output slew time to produce an estimated destination point slew time at each destination point of the output network. That is, in addition to determining the total combined delay from an input node to a given destination point, the slew time associated with that destination point waveform is also provided in accordance with exemplary embodiments of the present invention. Recall that in accordance with conventional timing verifiers, only the lumped capacitance of the interconnect was considered in assessing slew time at a destination point, such that the slew time of the output from gate 204 was considered equal to the slew time at the input of gates 206 and 208. However, as was described previously, because exemplary embodiments of the present invention take the resistance of the interconnect into account, the slew time at destination points 206 and 208 will not be equal to the slew time at the driving node 236.

In the above example, the slew time associated with the output of gate 204 was considered to be 4 nanoseconds. The differential estimated output network delay for the destination points 228 and 230 was considered to be 0.3 and 0.5 nanoseconds, respectively. In accordance with exemplary embodiments, any output network delay due to resistance is assumed to directly correlate to a change in slew time. Accordingly, the slew time at each of the destination points 228 and 230 is determined to be 4.3 nanoseconds and 4.5 nanoseconds, respectively.

Using the modified slew times as calculated for each of the destination points 228 and 230, more accurate signal delays for each of the gates 206 and 208 can be determined. Consequently, a more accurate delay associated with a signal path from the input node 202 to each of the output nodes 232 and 234 can be provided.

Those skilled in the art will appreciate that in actuality, a circuit as illustrated in FIG. 2, will typically include a much larger number of gates and a much larger number of interconnects. In accordance with exemplary embodiments, once slew times have been calculated for destination points, output slew times of the gates driven by those destination points will be modified. As mentioned previously, each time an output of a gate is modified, delays through the subsequent interconnect will be modified. Thus, in accordance with exemplary embodiments, an iterative approach is used to repeatedly calculate destination slew times and interconnect delays. This process can be repeated any number of times (e.g., two to three times or more) by sequencing through a netlist of components included in the electrical circuit. The process can be repeated until the delays and slew times converge within given thresholds.

Those skilled in the art will appreciate that although an exemplary embodiment has been described above, variations will be apparent. For example, instead of using a single differential delay for each destination point, multiple delta delays can be used. For example, a first differential delay can be determined for each destination point in the manner as described previously. A second differential delay can then be computed for the driving node 236. The difference between the first and second differential delays can then be added to an estimated output slew time to obtain an estimate of the output slew time at each destination point of the output network.

In a further alternate embodiment, an arbitrary input-slope gate model and an arbitrary strength sensitive RC delay calculator can be used to determine combined delay estimates for all gate instances of a netlist. More particularly, an initial estimate of the input slew time at every input pin of every gate instance can be obtained using, for example, the input-slope gate model to obtain these estimates for pins driven by some gate. For pins not driven by any gate (e.g., external inputs of the circuit), user-specified values can be used. Afterwards, a gate instance can be repeatedly chosen, and the steps described previously to compute estimates of combined delay and to compute output slew times for each destination point of each output network of the gate can be determined. In all cases, an input to the input-slope gate model would be the most recently obtained estimate of input slew time for the gate, such an estimate having been obtained either in the manner described previously or as output slew times of other gates. The choice of gates in this step would be governed by some predetermined iteration criterion set by the user.

An exemplary iteration criterion is as follows. Initially, the step of repeatedly choosing an instance from the netlist (such as a gate instance) and then using the steps described previously to compute estimates of combined delay and to compute output slew time for each destination point associated with gate instance can be performed. This process can be performed on all gates in a netlist using an input-to-output order (i.e., starting at the external inputs of a netlist and proceeding in topological order from inputs to outputs). Thereafter, a queue of gates can be maintained and reevaluated. At each iteration, the first gate in the queue can be chosen, reevaluated and removed from the queue. Gates are added to the queue based on a given criterion such as: every time the repeated choosing of a gate instance causes the estimated slew time and/or combined delay of a destination point to change by more than a minimum amount, any gate that has that destination point as an input can be added to (or maintained within) the queue. All gate instances of the netlist can be repeatedly processed using the foregoing steps until the contents of the queue are empty (i.e., all estimated slew times and/or combined delays have converged to a predetermined threshold).

Figure 4:
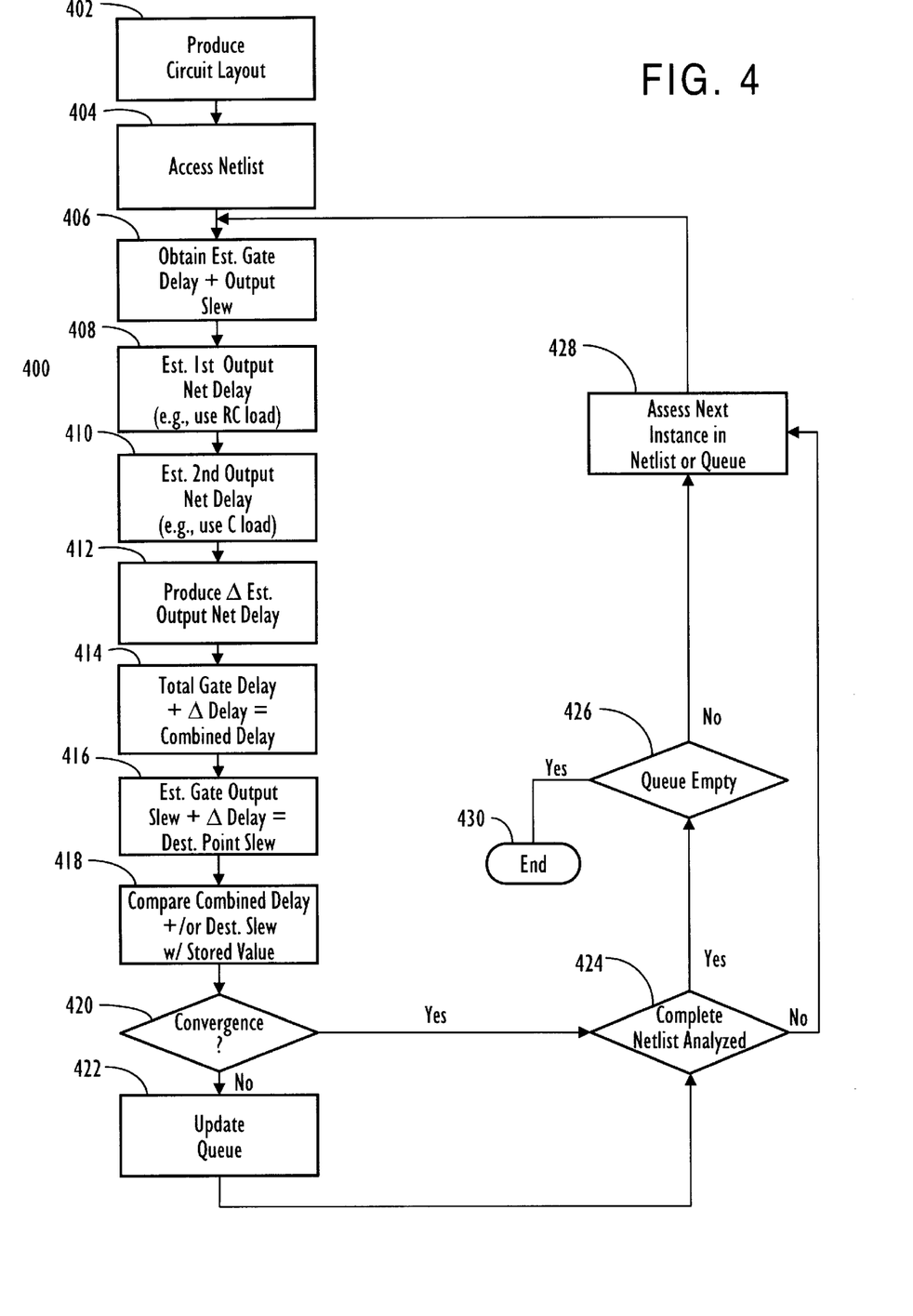
FIG. 4 illustrates an exemplary flow chart of steps in accordance with an embodiment of the present invention.

To illustrate an exemplary methodology implemented in accordance with the present invention, reference is now made to FIG. 4. The first step of the FIG. 4 flowchart 400 is the production of a circuit layout in step 402. In order to assess timing of the circuit layout in accordance with an exemplary embodiment of the present invention, instances (e.g., gate instances) of the circuit layout can be evaluated in topological order as described previously. For example, the first gate included in the netlist can be selected therefrom, and an associated gate model (e.g., an input-slope gate model) can be obtained from a library associated with the netlist. Such features are reflected in step 404.

Using the gate model for the gate under consideration, an estimated gate delay and output slew of the gate can be obtained using a gate model as reflected in step 406. As mentioned previously, any known gate model can be used in accordance with exemplary embodiments of the present invention.

In step 408, the output slew of the gate is supplied to a strength sensitive RC delay calculator such as that discussed in the aforementioned co-pending application. Such calculators operate by taking into account the resistance and capacitance of an interconnect. Accordingly, resistances of the interconnect can be used to produce an estimated first output network delay associated with the gate.

In step 410, the resistance associated with the interconnect can be set to zero and the output slew of the gate can again be supplied to the strength sensitive RC delay calculator. In this case, because the resistance is assumed zero, the RC delay calculator would produce a second estimated output network delay based only on the non-resistive load of the interconnect (e.g., the lumped capacitance of the interconnect).

In step 412, a delta delay is produced as a differential output network delay representing the difference between the estimated first output network delay (i.e., produced using the resistance and capacitance of the interconnect) and the second estimated output network delay (i.e., produced using only the non-resistive load of the interconnect). The differential estimated output network delay is thus a delay proportional to the resistance of the interconnect. This differential estimated output network delay can then be stored in the memory for the associated destination point.

In steps 414 and 416, a combined delay and an estimated destination point slew time are determined for a given destination point of the gate under consideration. Steps 414 and 416 are repeated for each destination point of the gate under consideration. For example, a combined delay and an estimated destination point slew time are produced for each of the destination points 228 and 230 in FIG. 2, as described previously.

More particularly, the total gate delay associated with the driving gate 204 of FIG. 2 is combined with the differential estimated output network delay as calculated by the strength sensitive RC delay calculator to produce a combined delay for the definition point 228. This step is repeated for the destination point 230. Note that the differential estimated output network delay for the points 228 and 230 will differ depending on the resistance associated with the paths from the driving node 236 to each of these respective points.

In step 416, an estimated destination point slew time is produced as a combination of the estimated gate output slew time and the differential estimated output network delay associated with a given destination point. Note that because changes in the slew time are assumed to be directly related to changes in the differential estimated output network delay, exemplary embodiments produce an estimated destination point slew time by adding the differential estimated output network delay for a given destination point to the estimated gate output slew time.

The combined delay and the estimated destination point slew time as determined in steps 414 and 416 can be stored in association with each of the destination points. During a first pass through the netlist, values of the combined delay and the estimated destination point slew time can be determined and stored for each gate instance. However, as mentioned previously, those skilled in the art will appreciate that each time the destination point slew time is updated for a given destination point, an output slew time of a gate connected to the destination point will no longer be valid.

For example, in the exemplary FIG. 2 embodiment, each time the destination point slew time at nodes 228 and 230 is updated, a new output slew time from each of gates 206 and 208 should be determined using the gate models for gates 206 and 208, respectively. Accordingly, exemplary embodiments repeat the steps of FIG. 4 in an iterative manner as described previously, until combined delays and/or destination point slew times have converged to within a predetermined threshold.

For this purpose, the exemplary FIG. 4 flowchart includes a step at 418 for comparing a combined delay and/or estimated destination point slew time with previously stored values to determine whether the difference between current values and previous values has changed by less than a predetermined value. If so, then convergence of the value associated with a given destination point can be deemed to have been attained. If not, then a queue can be updated to include a listing of those gates which have the destination point as an input.

More particularly, in step 420, changes in the combined delay and/or estimated destination point slew time are compared with a predetermined threshold or thresholds. If convergence is attained, then elements of the netlist which use that destination point are removed from the queue in step 422. However, if convergence of the destination point is not reached, then all instances which have the destination point as their input can be included in the netlist at step 422. Thus, interconnect delays downstream of the destination point can be recalculated using the revised combined delay and/or destination point slew time.

In step 424, the netlist is examined to ensure that all instances listed therein have been evaluated. If not, the next instance is evaluated via step 428. If the entire netlist has been evaluated, the queue is evaluated in step 426. Here, a decision is made as to whether the queue is empty. If so, then the timing verification is completed as reflected by step 430. If not, then flow returns to step 406 via step 428, wherein elements listed in the queue are reevaluated based on the order they appear in the original netlist.

Figures 5A, 5B:
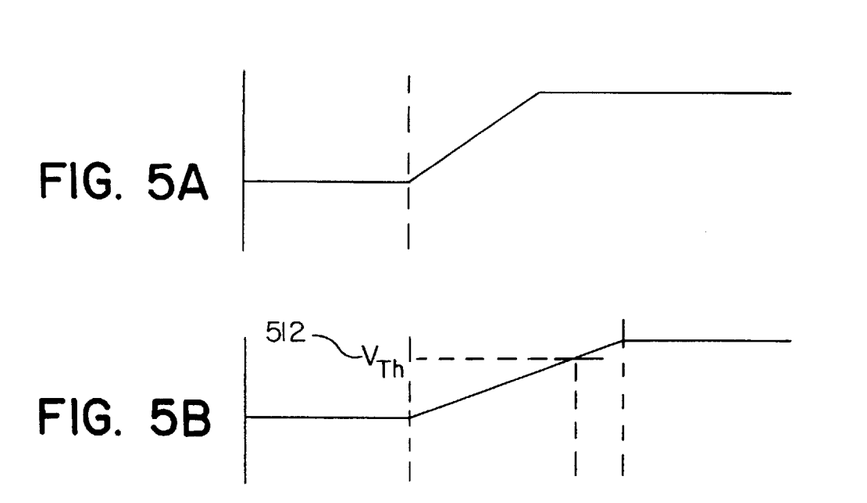
FIGS. 5A–5C illustrate the correlation of an estimated output network delay to a change in destination point slew time.
Figure 5C:
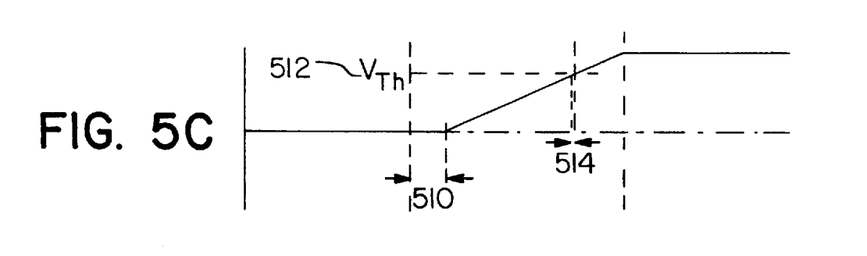

Having described a methodology in accordance with an exemplary embodiment of the present invention, reference is now made to FIGS. 5A–5C to illustrate the assumption made in accordance with exemplary embodiments of the present invention whereby changes in the differential estimated output network delay are considered directly related to changes in destination point slew time. FIG. 5A illustrates an exemplary waveform of the driving node 236 of FIG. 2. FIG. 5B illustrates how a delay to the resistance of the interconnect is considered to be directly related to an increase in the destination point slew time such as might occur at destination point 228 of FIG. 2. In the FIG. 5B waveform, the change in slope due to resistance of the interconnect can be seen to have influenced the slope of the waveform. That is, the total delay associated with the resistance has been translated into a change in slope of the destination point waveform.

FIG. 5C illustrates what may in fact be the actual waveform at the destination point 228. However, Applicants have discovered that the entire delay due to resistance can be directly correlated to a change in slope of the output waveform, and have only a negligible effect on timing delay determinations. This validity of this assumption can be understood, at least in part, by considering a delay attributable to the interconnect as having a relatively flat portion 510 (as illustrated in FIG. 5C) followed by a steeper slope than was estimated using the FIG. 5B waveform. Assuming that the threshold for determining a transition in logic state is the transition point 512 of FIGS. 5B and 5C, a difference in the transposition to the X-axis of the points at which the FIGS. 5B and 5C waveforms cross this threshold can be seen to be negligible. That is, the difference labeled 514 will not contribute to a noticeable error in calculating timing delays of the circuit. Thus, exemplary embodiments of the present invention can provide a highly accurate determination of the timing delays in the circuit.

Those skilled in the art will appreciate that while a strength sensitive RC delay calculator has been described wherein first and second interconnect delays are determined as functions of the resistive-capacitive load and of the capacitive load respectively, a delta delay can of course be produced directly as a function of the output network's resistive load.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of verifying operation of an electrical circuit comprising the steps of:

producing an electrical circuit having at least one gate and an output network connected with the gate;

obtaining an estimated total gate delay and an estimated gate output slew time of the gate using a gate timing model;

producing a differential estimated output network delay as a function of output network resistance and estimated gate driving strength for a destination point of the output network;

combining the estimated total gate delay and the estimated output network delay to produce a combined delay from an input of the gate to said destination point; and using said combined delay to verify operation of said electrical circuit.

2. A method according to claim 1, wherein said estimated gate driving strength is a ramp factor which is a function of said estimated gate output slew time.

3. A method according to claim 2, wherein said ramp factor is obtained by dividing said estimated gate output slew time by a load of said output network.

4. A method according to claim 1, wherein said load is a capacitive load of said output network.

5. A method according to claim 1, wherein said step of producing a differential estimated output network delay as a function of output network resistance is performed for each of a plurality of destination points, each of said destination points representing an input to a subsequent gate.

6. A method according to claim 5, wherein said step of combining the estimated total gate delay and the differential estimated output network delay is performed separately for each of said plurality of destination points.

7. A method according to claim 1, wherein said step of combining the estimated total gate delay and the differential estimated output network delay is performed separately for each of a plurality of destination points.

8. A method according to claim 1, wherein said step of producing a differential estimated output network delay further includes the steps of:

determining a first interconnect delay as a function of the resistance and capacitance of the output network;

determining a second interconnect delay as a function of the capacitance of the output network; and determining said differential estimated output network delay as the difference between said first interconnect delay and said second interconnect delay.

9. A method according to claim 1, further comprising a step of:

combining the differential estimated output network delay and the estimated gate output slew time to produce an estimated destination point slew time at said destination point of the output network.

10. A method according to claim 1, wherein said step of obtaining further includes the step of:

establishing said gate timing model as a function of timing parameter values for the gate, as a function of an input slew time of an input signal to the gate, and as a function of total non-resistive load of the output network.

11. A method according to claim 9, wherein said steps of combining the estimated total gate delay and the differential estimated output network delay, and the step of combining the differential estimated output network delay and the estimated gate output slew time are repeated iteratively until a threshold convergence is achieved.

12. A method of verifying operation of an electrical circuit comprising the steps of:

producing an electrical circuit having at least one gate and an output network connected with the gate;

obtaining an estimated total gate delay and an estimated gate output slew time of the gate using a gate timing model;

producing an estimated output network delay as a function of output network resistance and estimated gate driving strength for a destination point of the output network;

combining the estimated output network delay and the estimated gate output slew time to produce an estimated destination point slew time at said destination point of the output network; and using said estimated destination point slew time to verify operation of said electrical circuit.

13. A method according to claim 12, wherein said estimated gate driving strength is a ramp factor which is a function of said estimated gate output slew time.

14. A method according to claim 13, wherein said ramp factor is obtained by dividing said estimated gate output slew time by a load of said output network.

15. A method according to claim 14, wherein said load is a capacitive load of said output network.

16. An apparatus for verifying operation of an electrical circuit comprising:

means for producing an electrical circuit having at least one gate and an output network connected with the gate, said gate having an estimated total gate delay and a differential estimated gate output slew time;

means for producing an estimated output network delay as a function of output network resistance and estimated gate driving strength for a destination point of the output network; and means for processing the estimated total gate delay and the estimated output network delay to produce a combined delay from an input of the gate to said destination point, and for using said combined delay to verify operation of said electrical circuit.

17. An apparatus according to claim 16, wherein said means for processing further combines the estimated output network delay and the estimated gate output slew time to produce an estimated destination point slew time at said destination point.

18. An apparatus for verifying operation of an electrical circuit comprising:

a strength sensitive resistance-capacitance delay calculator for producing a differential estimated output network delay as a function of output network resistance and estimated gate driving strength for a destination point of the output network; and a processor for combining an estimated total gate delay of at least one gate in an electrical circuit with the differential estimated output network delay to produce a combined delay from an input of the gate to said destination, and for using said combined delay to verify operation of said electrical circuit.

19. Apparatus according to claim 18, wherein said processor further combines the differential estimated output network delay and an estimated gate output slew time to produce an estimated destination point slew time at said destination point of the output network.

* * * * *